United States Patent
Ojima (10) Patent No.: US 8,476,170 B2
(45) Date of Patent: Jul. 2, 2013

(54) METHOD OF FORMING PATTERN, METHOD OF MANUFACTURING SEMICONDUCTOR DEVICE, AND METHOD OF MANUFACTURING TEMPLATE

(75) Inventor: Tomoko Ojima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 13/233,770

(22) Filed: Sep. 15, 2011

(65) Prior Publication Data

US 2012/0149211 A1 Jun. 14, 2012

(30) Foreign Application Priority Data

Dec. 10, 2010 (JP) ................... 2010-275279

(51) Int. Cl.
*H01L 21/24* (2006.01)
(52) U.S. Cl.
USPC ........... 438/758; 438/597; 438/674; 438/678; 257/E21.24
(58) Field of Classification Search
USPC ............. 438/758, 597, 674, 678; 257/E21.24
See application file for complete search history.

(56) References Cited

U.S. PATENT DOCUMENTS

| 7,235,474 B1 * | 6/2007 | Dakshina-Murthy et al. ............ 438/597 |
| 2008/0090170 A1 | 4/2008 | Yoneda |

FOREIGN PATENT DOCUMENTS

| JP | 2008-091782 | 4/2008 |
| JP | 4151420 | 7/2008 |
| JP | 2008-244259 | 10/2008 |
| JP | 2009-060084 | 3/2009 |
| JP | 2009-266841 | 11/2009 |
| JP | 2010-076219 | 4/2010 |

* cited by examiner

*Primary Examiner* — Thinh T Nguyen
(74) *Attorney, Agent, or Firm* — Finnegan, Henderson, Farabow, Garrett & Dunner, L.L.P.

(57) ABSTRACT

According to one embodiment, a pattern formation method includes, before forming a circuit pattern on a substrate using imprinting, a wall pattern with a predetermined height is formed to surround the periphery of an area serving as imprint shots on the substrate in each imprint shot and to allow the imprint shots to be separated from one another. The circuit pattern is formed in the imprint shots surrounded by the wall pattern through imprinting.

18 Claims, 12 Drawing Sheets

METHOD OF FORMING PATTERN, METHOD OF MANUFACTURING SEMICONDUCTOR DEVICE, AND METHOD OF MANUFACTURING TEMPLATE

CROSS-REFERENCE TO RELATED APPLICATIONS

This application is based upon and claims the benefit of priority from the prior Japanese Patent Application No. 2010-275279, filed on Dec. 10, 2010; the entire contents of which are incorporated herein by reference.

FIELD

Embodiments described herein relate generally to a method of forming a pattern, a method of manufacturing a semiconductor device, and a method of manufacturing a template.

BACKGROUND

As an example of a method of coating resist (an imprint material) used for imprinting on a wafer, an inkjet method has been disclosed. In this method, resist sufficient for imprinting is coated based on a pattern of a template, resulting in the improvement of filling efficiency of resist. Furthermore, since imprinting equipment coats resist in units of a shot, a wafer coated with resist does not move in the imprinting equipment.

However, coating amount control of a picoliter order is required in the coating of resist using the inkjet method. If a variation occurs in the coating amount, excess resist may overflow to boundaries with neighborhood shots. If resist overflows, a pattern formation defect may occur in neighborhood shots.

In this regards, conventionally, a template is provided with a gap area (a street) for preventing the overflow of resist among shots. However, due to the gap area, the number of chips manufacturable from one wafer may be reduced. What is therefore required is a method capable of manufacturing a large number of chips from one wafer while preventing a pattern formation defect.

DETAILED DESCRIPTION

An embodiment provides a pattern formation method. In the pattern formation method, before forming a circuit pattern on a substrate using imprinting, a wall pattern with a predetermined height is formed to surround the periphery of an area serving as imprint shots on the substrate in each imprint shot and to allow the imprint shots to be separated from one another. Next, an imprint material drops in each imprint shot surrounded by the wall pattern. Then, a template is firmly pressed to the imprint material, so that the circuit pattern is formed in the imprint shots surrounded by the wall pattern.

Hereinafter, a pattern formation method, a method of manufacturing a semiconductor device, and a method of manufacturing a template according to embodiments will be described in detail with reference to the accompanying drawings. In addition, the present invention is not limited to the embodiments.

(First Embodiment)

Figure 1A:
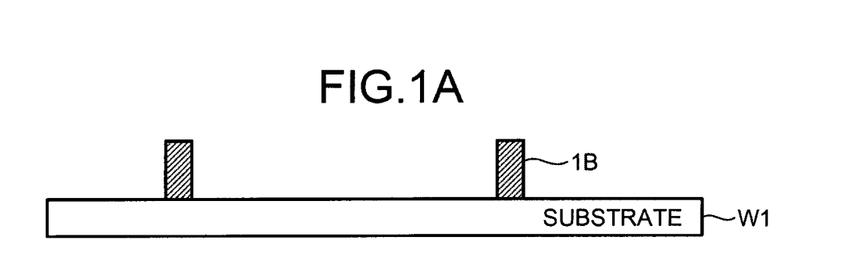
FIGS. 1A to 1C are diagrams explaining the concept of a pattern formation method according to a first embodiment.
Figure 1B:
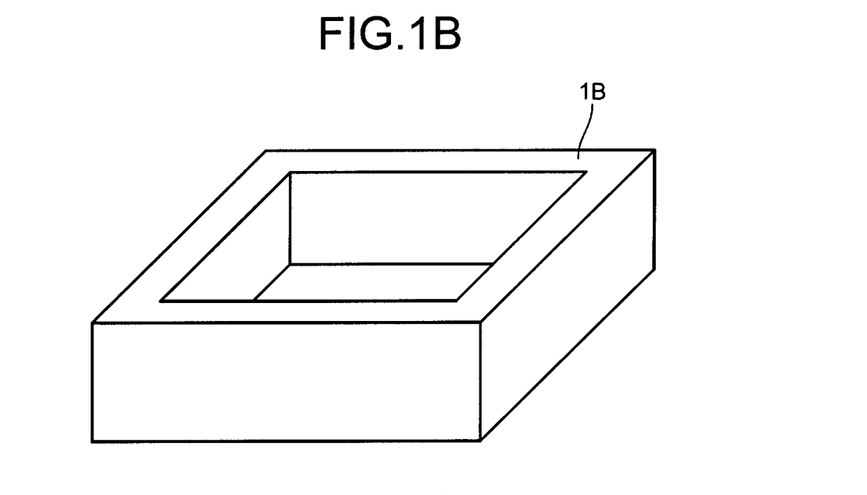
Figure 1C:
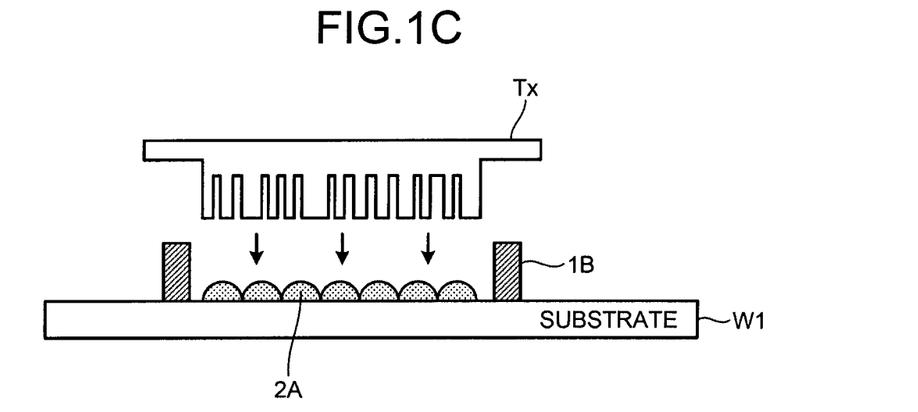

FIGS. 1A to 1C are diagrams explaining the concept of a pattern formation method according to a first embodiment. FIGS. 1A and 1C are sectional views of a substrate W1, and FIG. 1B is a perspective view of a shot-surrounding pattern 1B which will be described later. The substrate W1 includes a wafer and the like in which a semiconductor device (a semiconductor integrated circuit) is formed.

In the present embodiment, before an imprint material (imprint resist) is coated on the substrate W1, a resist pattern is formed on the substrate W1 using photolithography and the like. The resist pattern is a wall pattern (hereinafter, referred to as a shot-surrounding pattern 1B) which surrounds each shot area (imprint shot) at the time of imprinting. The shot-surrounding pattern 1B is arranged at the outer side (among imprint shots) of each imprint shot. In other words, the shot-surrounding pattern 1B is a wall pattern which surrounds the periphery of an area serving as imprint shots on the substrate W1 in each imprint shot, thereby allowing the imprint shots to be separated from one another.

As illustrated in FIG. 1A, the shot-surrounding pattern 1B has a predetermined height. Furthermore, when the shot-surrounding pattern 1B is viewed from the top, the shot-surrounding pattern 1B, for example, has a structure in which an outer frame and an inner frame thereof have a rectangular loop shape.

As illustrated in FIG. 1B, the shot-surrounding pattern 1B has a structure in which the inner side of a columnar structure thereof is peeled off and the top surface and the bottom surface thereof are removed. In other words, the shot-surrounding pattern 1B has a box (tube) shape with no top surface and bottom surface. Furthermore, an area of the bottom surface side of the shot-surrounding pattern 1B serves as the surface of the substrate W1.

After the shot-surrounding pattern 1B is formed on the substrate W1, imprint resist 2A is coated on (drops in) the inner side of the shot-surrounding pattern 1B as illustrated in FIG. 1C. The imprint resist 2A, for example, is photocurable resist (a filling material).

After the imprint resist 2A is coated, a template Tx is firmly pressed (imprinted) to the imprint resist 2A. Thus, the imprint resist 2A is interposed between the template Tx and the substrate W1, and is filled in a template pattern (a groove) formed in the template Tx. Moreover, excess imprint resist 2A overflows from the template Tx. The overflowed imprint resist 2A (outflow fluid) is blocked by the shot-surrounding pattern 1B.

As described above, in the present embodiment, before forming a circuit pattern in the substrate W1 using imprinting, the shot-surrounding pattern 1B (the wall pattern) is formed on the substrate W1. Consequently, the imprint resist 2A overflowed at the time of imprinting can be prevented from being introduced into adjacent imprint shots.

Figure 2:
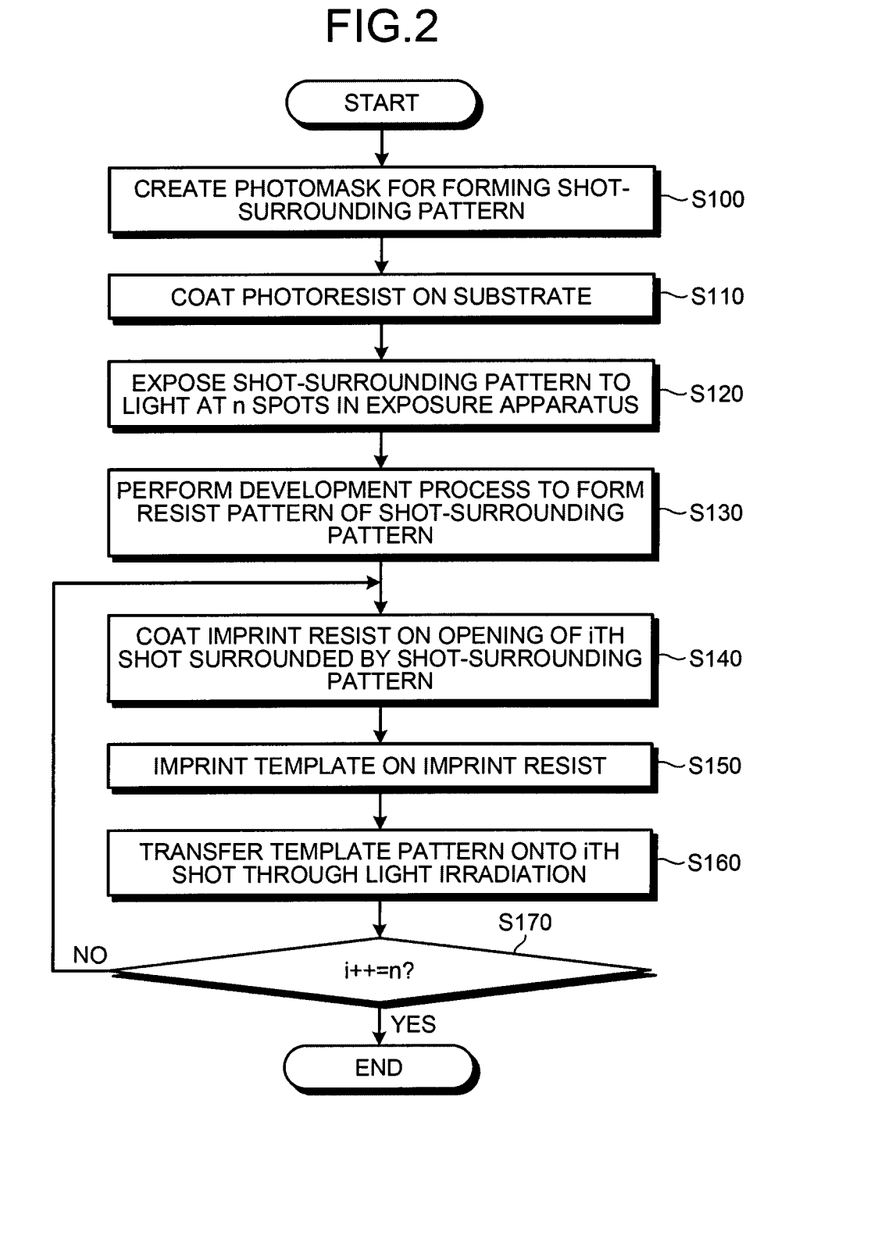
FIG. 2 is a flowchart illustrating the procedure of a pattern formation process according to the first embodiment.

FIG. 2 is a flowchart illustrating the procedure of a pattern formation process according to the first embodiment. A photomask for forming the shot-surrounding pattern 1B is created (step S100). A mask pattern corresponding to the shot-surrounding pattern 1B has been formed on the photomask. Then, photoresist is coated on the substrate W1 using a resist coating apparatus (step S110).

Furthermore, the photomask is carried into an exposure apparatus such as a stepper. In the exposure apparatus, the shot-surrounding pattern 1B is exposed to light at n (n is a natural number) spots on the substrate surface by using the photomask. In this way, exposure processes corresponding to n shots are performed on the substrate W1 (step S120). Then, a development process of the substrate W1 is performed using a development apparatus and the like. Thus, a resist pattern as the shot-surrounding pattern 1B is formed on the substrate W1 by the number of the n shots (step S130).

The imprint resist 2A is coated on the opening of an ith shot (i is 1 to n) surrounded by the shot-surrounding pattern 1B (step S140). The template Tx is imprinted on the imprint resist 2A coated on the opening of the ith shot (step S150). Then, over a predetermined time, the state is maintained in which the template Tx has been firmly pressed to the imprint resist 2A. Thus, the imprint resist 2A is filled in the template pattern formed in the template Tx.

Thereafter, in the state in which the template Tx has been firmly pressed to the imprint resist 2A, light is irradiated from the above of the template Tx. Through the light irradiation, the template pattern is transferred onto the ith shot (step S160). The transferred template pattern corresponds to imprint resist 2B which will be described later.

It is determined whether an imprint shot with the transferred template pattern is the nth shot (step S170). If the imprint shot with the transferred template pattern is not the nth shot (No in step S170), the processes of steps S140, S150, S160, and S170 are repeated. Then, if the template pattern is transferred onto the substrate W1 from the first shot to the nth shot (Yes in step S170), the imprint process for the substrate W1 is completed.

Figure 3A:
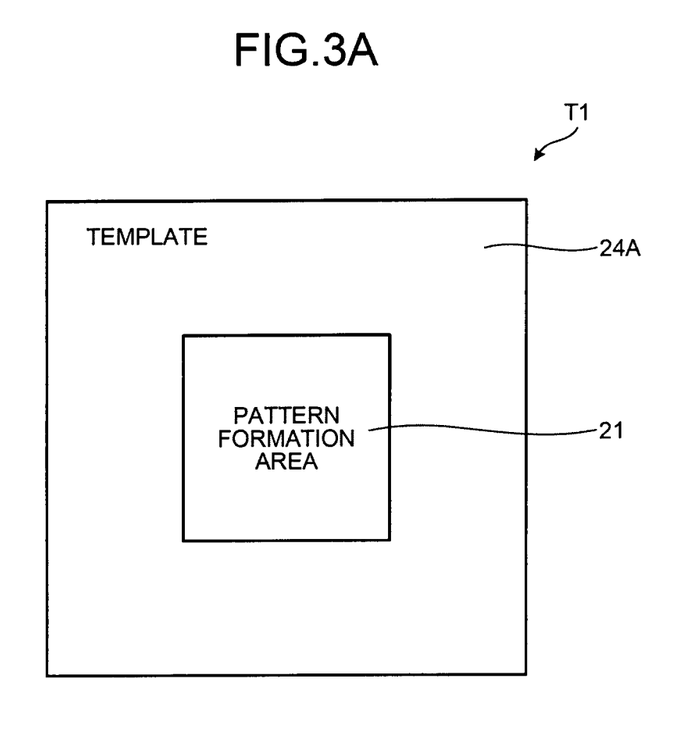
FIGS. 3A and 3B are diagrams illustrating a configuration example of a template.
Figure 3B:
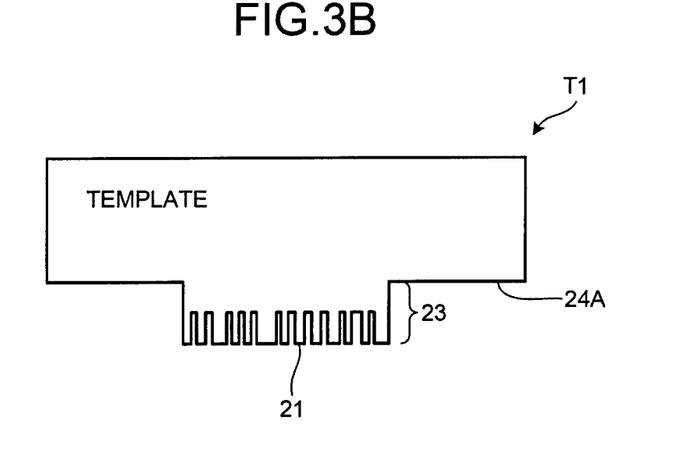

Hereinafter, a configuration example of the template Tx will be described. FIGS. 3A and 3B are diagrams illustrating a configuration example of a template. FIG. 3A is a bottom view of a template T1 which is an example of the template Tx, and FIG. 3B is a sectional view of the template T1.

The template T1 is made of a light transmissive material (e.g. quartz glass). As illustrated in FIG. 3A, the template T1 has a main surface with a rectangular shape. On the bottom surface of the template T1, a pattern formation area 21 having a rectangular shape is arranged at the approximately center of the bottom surface thereof. The pattern formation area 21 has a concave-convex surface on which the transfer pattern (the template pattern) of the template T1 has been engraved.

Of the bottom surface of the template T1, an outer peripheral area (a rectangular loop area), other than the pattern formation area 21, is a non-transfer area (an off-active area) 24A. In the non-transfer area 24A, a pattern such as a template pattern is not formed.

Furthermore, as illustrated in FIG. 3B, a predetermined step difference 23 exists between the non-transfer area 24A and the pattern formation area 21. In the template T1, at the time of an imprint process, the pattern formation area 21 makes contact with the imprint resist 2A and the non-transfer area 24A does not make contact with the imprint resist 2A and the shot-surrounding pattern 1B. In other words, in the template T1, the pattern formation area 21 is thicker than the non-transfer area 24A by the step difference 23.

Figure 4A:
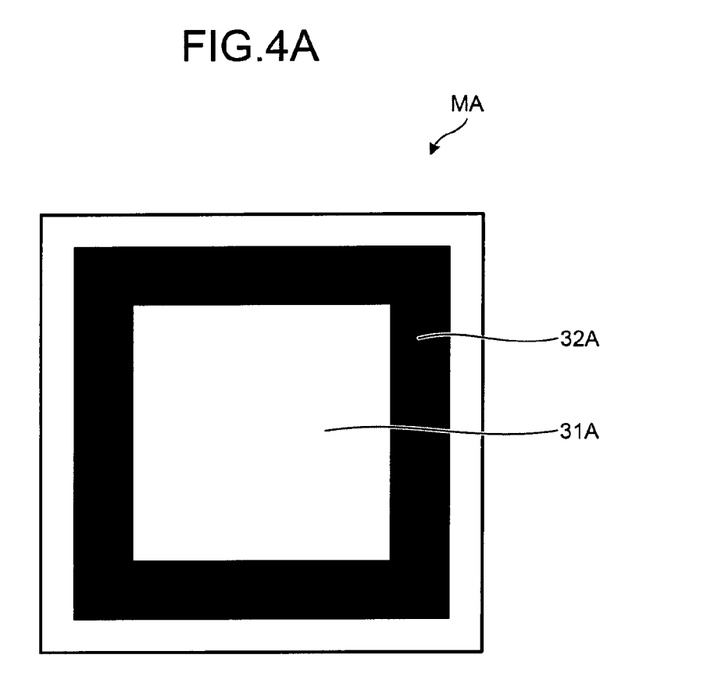
FIGS. 4A and 4B are diagrams illustrating a configuration example of a photomask.
Figure 4B:
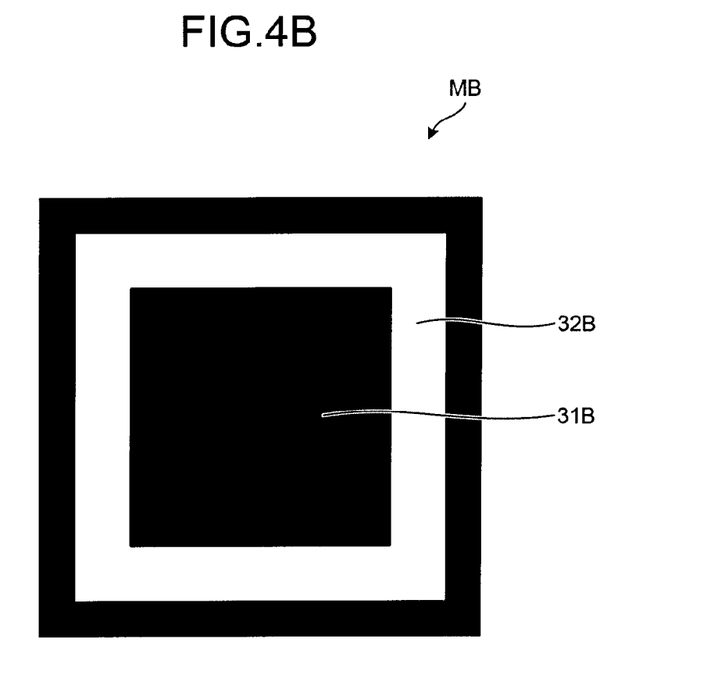

Next, a configuration example of a photomask will be described. FIGS. 4A and 4B are diagrams illustrating a configuration example of the photomask. FIGS. 4A and 4B are plan views of photomasks MA and MB. The photomask MA is made of a light transmissive material (e.g. quartz glass).

As illustrated in FIG. 4A, the photomask MA is provided in the mask surface thereof with a light transmission unit 31A and a light blocking unit 32A. The light transmission unit 31A denotes an area (including no pattern) for allowing exposure light sent from an exposure light source to pass therethrough when exposure is performed for the substrate W1. The light blocking unit 32A denotes an area (a pattern formation unit) for blocking the exposure light sent from the exposure light source when the exposure is performed for the substrate W1. The light blocking unit 32A, for example, is made of chrome. The light blocking unit 32A is a pattern corresponding to the shot-surrounding pattern 1B. The photomask MA is used when photoresist 1A is positive resist.

The light blocking unit 32A (the shot-surrounding pattern 1B) has an opening larger than the pattern formation area 21. The size of the opening of the light blocking unit 32A is set based on the shot matching accuracy of imprinting equipment.

Meanwhile, when the photoresist 1A is negative resist, the photomask MB is used in which the light transmission unit 31A and the light blocking unit 32A of the photomask MA are inverted from each other as illustrated in FIG. 4B. The photomask MB is provided in the mask surface thereof with a light transmission unit 32B and a light blocking unit 31B. The light transmission unit 32B denotes an area for allowing the exposure light sent from the exposure light source to pass therethrough when the exposure is performed for the substrate W1. The light blocking unit 31B denotes an area for blocking the exposure light sent from the exposure light source when the exposure is performed for the substrate W1. Hereinafter, the following description will be given for the case where the photoresist 1A is positive resist and the photomask MA is used as a photomask.

Figure 5A:
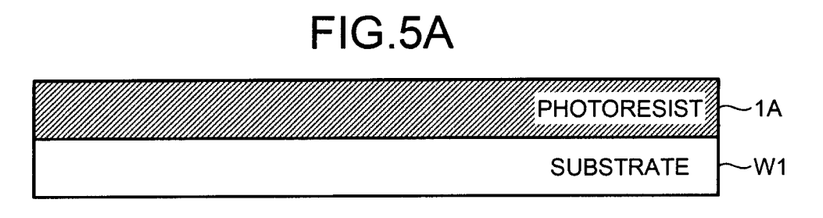
FIGS. 5A to 5F are diagrams explaining the procedure of a pattern formation process according to the first embodiment.

FIGS. 5A to 5F are diagrams explaining the procedure of a pattern formation process according to the first embodiment. FIGS. 5A to 5F are sectional views of the substrate W1. As illustrated in FIG. 5A, the photoresist 1A is coated on the substrate W1 on which a film (not illustrated) to be processed has been formed. The photoresist 1A is positive type photoresist, and the thickness of a film to be coated is equal to or less than the value of the step difference 23 between the pattern formation area 21 (an active area) and the non-transfer area 24A (an off-active area), which are illustrated in FIG. 3B.

Figure 5B:
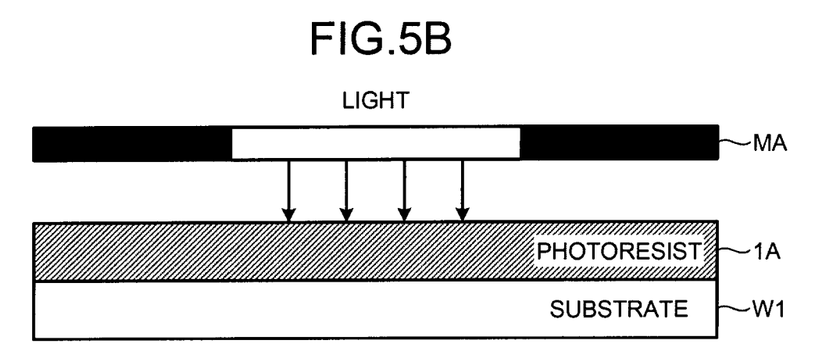

Then, as illustrated in FIG. 5B, the photoresist 1A on the substrate W1 is exposed to light using the photomask MA. For example, the photoresist 1A is exposed to light on the substrate W1 using a scan type exposure apparatus by the number of shots to be patterned. At this time, a step pitch interval (an interval between shots to be scanned) of a scanner is the width (a thickness viewed from the upper surface side)

of a wall surface of the shot-surrounding pattern 1B (the outer periphery of an imprint shot area 3). In other words, the step pitch interval of the scanner is the distance from the outermost peripheral part (e.g. the right end) of one side of the light blocking unit 32A to the outermost peripheral part (e.g. the left end) of the opposite side of the light blocking unit 32A.

Figure 5C:
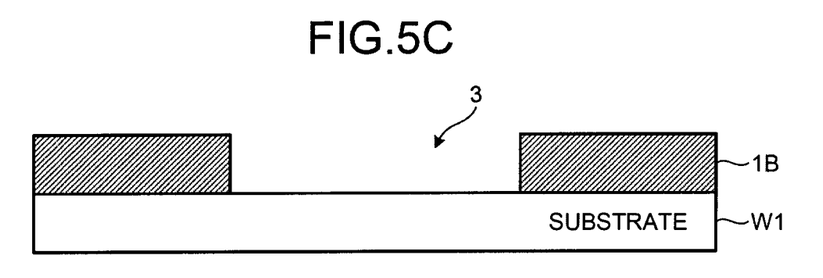

After the photoresist 1A is exposed to light, a development process of the substrate W1 is performed. Thus, the photoresist 1A remains only in an unexposed area (a lattice-shaped area of an outer periphery of each shot and a wafer peripheral area). As a consequence, a resist pattern corresponding to the mask pattern of the photomask MA is formed. Here, the resist pattern is the shot-surrounding pattern 1B. Thus, as illustrated in FIG. 5C, the shot-surrounding pattern 1B is formed on the substrate W1. An area surrounded by the shot-surrounding pattern 1B is the imprint shot area (the transfer area) 3.

Figure 5D:
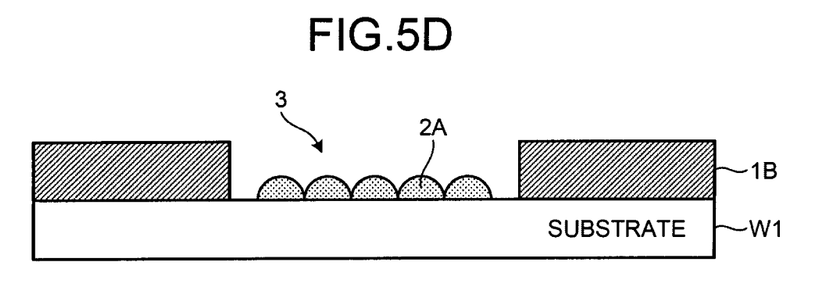

Then, as illustrated in FIG. 5D, the imprint resist 2A is coated on the imprint shot area 3. The imprint resist 2A is a liquid-phase light curable organic material, and for example, an acrylic monomer.

Figure 5E:
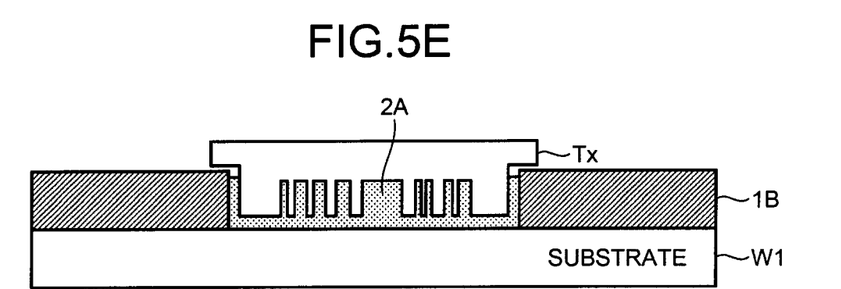

After the imprint resist 2A is coated, the template Tx is firmly pressed to the imprint resist 2A as illustrated in FIG. 5E. Thus, the imprint resist 2A is filled in the template pattern formed in the template Tx. In other words, the template Tx is allowed to make contact with the imprint resist 2A, so that the liquid-phase imprint resist 2A flows and enters the template Tx along the concave-convex pattern of the template Tx. At this time, the wall of the shot-surrounding pattern 1B serving as the outer periphery of the imprint shot area 3 prevents the imprint resist 2A from overflowing to an adjacent transfer area.

Figure 5F:
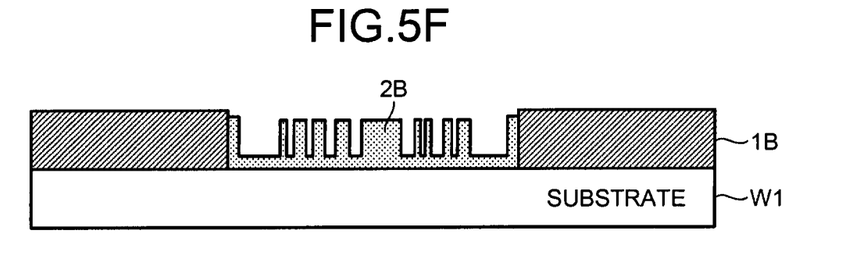

Thereafter, the imprint resist 2A is subject to light irradiation in the state in which the template Tx has been firmly pressed to the imprint resist 2A, so that the imprint resist 2A is cured. The light irradiated onto the template Tx is not limited if it can cure the light curable organic material, and for example, lamp light can be used. Thus, the imprint resist 2A is patterned as illustrated in FIG. 5F. That is, the imprint resist 2A is changed into imprint resist 2B through the patterning.

After the imprint resist 2B is formed, the template Tx is separated (released) from the substrate W1. In this state, since the imprint resist 2B has been already cured, the state (shape) when the template Tx is in a contact state is maintained, resulting in the formation of an imprint pattern corresponding to one shot.

The processes illustrated in FIGS. 5D to 5F are repeated, so that desired concave-convex patterns corresponding to a plurality of shorts are formed on the substrate W1. Then, a film (not illustrated) to be processed on the surface of the substrate W1 is etched using the patterned imprint resist 2B as a mask, so that the film is patterned.

The above-mentioned process of forming the imprint resist 2B is performed on the entire surface of the substrate W1. Thus, the imprint resist 2B is formed on all the imprint shot areas 3 of the substrate W1.

Figure 6A:
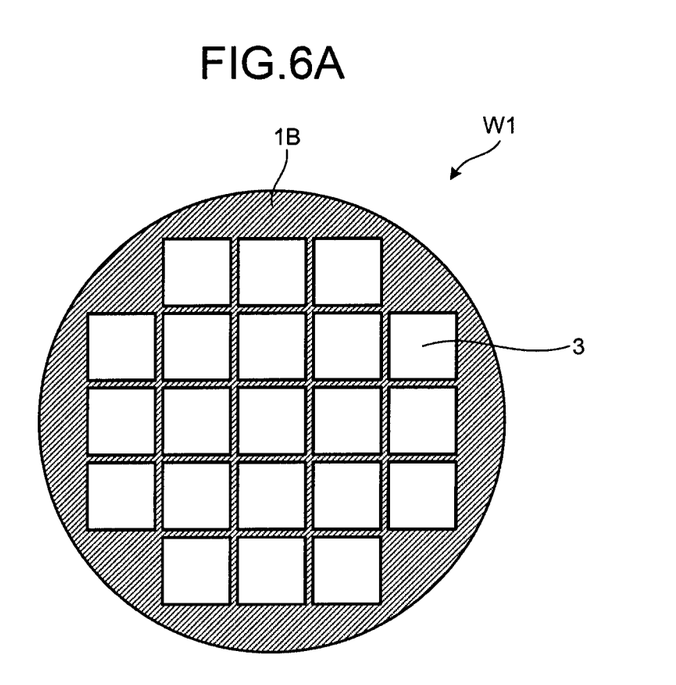
FIGS. 6A and 6B are diagrams explaining an arrangement position of a shot-surrounding pattern according to the first embodiment.
Figure 6B:
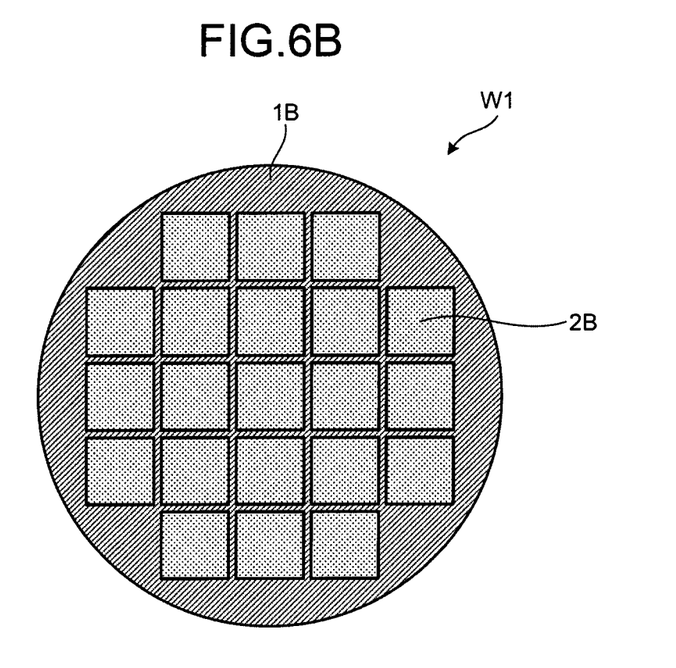

FIGS. 6A and 6B are diagrams explaining an arrangement position of the shot-surrounding pattern according to the first embodiment. FIGS. 6A and 6B are plan views of the substrate W1. FIG. 6A corresponds to FIG. 5C and FIG. 6B corresponds to FIG. 5F.

A resist pattern corresponding to the mask pattern of the photomask MA is formed on the substrate W1, so that the shot-surrounding pattern 1B is formed on the substrate W1 as illustrated in FIG. 6A. Furthermore, areas surrounded by the shot-surrounding pattern 1B are the imprint shot areas 3.

Imprinting is performed in each imprint shot on the substrate W1, so that the imprint resist 2B is formed in the imprint shot areas 3 on the substrate W1 as illustrated in FIG. 6B. At this time, since the shot-surrounding pattern 1B presents as an outer peripheral wall among the imprint shots, the substrate W1 is not exposed.

In addition, FIGS. 6A and 6B illustrate the case in which no gap exists between an adjacent shot-surrounding pattern 1B and the shot-surrounding pattern 1B, and the shot-surrounding pattern 1B is continuously formed. Furthermore, FIGS. 6A and 6B illustrate the case in which the shot-surrounding pattern 1B is not formed in the vicinity of the outer periphery of the substrate W1. In the present embodiment, a gap may exist between an adjacent shot-surrounding pattern 1B and the shot-surrounding pattern 1B. Furthermore, the shot-surrounding pattern 1B may be formed in the vicinity of the outer periphery of the substrate W1.

The process of forming the shot-surrounding pattern 1B when performing the imprint process, for example, is performed in each layer of a wafer process. Then, etching is performed from the upper portion of the imprint resist 2B formed on the substrate W1, so that a film to be processed on the substrate W1 is patterned. When manufacturing a semiconductor device, the formation process of the shot-surrounding pattern 1B, the imprint lithography, the etching process and the like are repeated in each layer.

So far, the present embodiment has described the case in which the substrate W1 is a wafer and the like for forming a semiconductor device. However, the substrate W1 may be a template for imprinting. In such a case, a template formed as the substrate W1 is a slave template of the template Tx. In other words, the template Tx is a master template and the substrate W1 is a slave template. In such a case, a semiconductor device is formed in a wafer and the like, which are different from the substrate W1, through imprinting using the slave template.

Furthermore, the present embodiment has described the case in which the shot-surrounding pattern 1B is formed using the photolithography. However, the shot-surrounding pattern 1B may also be formed using EB (electron beam) drawing or DSA (direct self-assembly) lithography. Furthermore, the shot-surrounding pattern 1B may also be formed using imprint lithography.

As described above, since a gap (a street) for preventing the overflow of resist among shots in imprinting is not required, it is possible to reduce a shot size. Therefore, the number of chips manufacturable from one substrate W1 is increased. Furthermore, it is possible to avoid the occurrence of a pattern defect (breakage and the like of a substrate surface) caused by the engraving on overflowed resist.

According to the first embodiment as described above, before the imprint resist 2A is coated on the substrate W1, since the shot-surrounding pattern 1B is formed on the substrate W1, it is possible to prevent the imprint resist 2A from overflowing to an adjacent shot by the shot-surrounding pattern 1B, resulting in the prevention of a pattern formation defect.

Furthermore, it is possible to prevent the overflow of the imprint resist 2A by the shot-surrounding pattern 1B with a narrow area, resulting in the formation of many shot patterns on one substrate W1.

(Second Embodiment)

Next, a second embodiment will be described with reference to FIGS. 7, 8A to 8D, 9, 10A and 10B, and 11A and 11B. In the second embodiment, a shot-surrounding pattern (a shot-surrounding pattern 5B which will be described later) is formed using a hard mask layer on a substrate.

Figure 7:
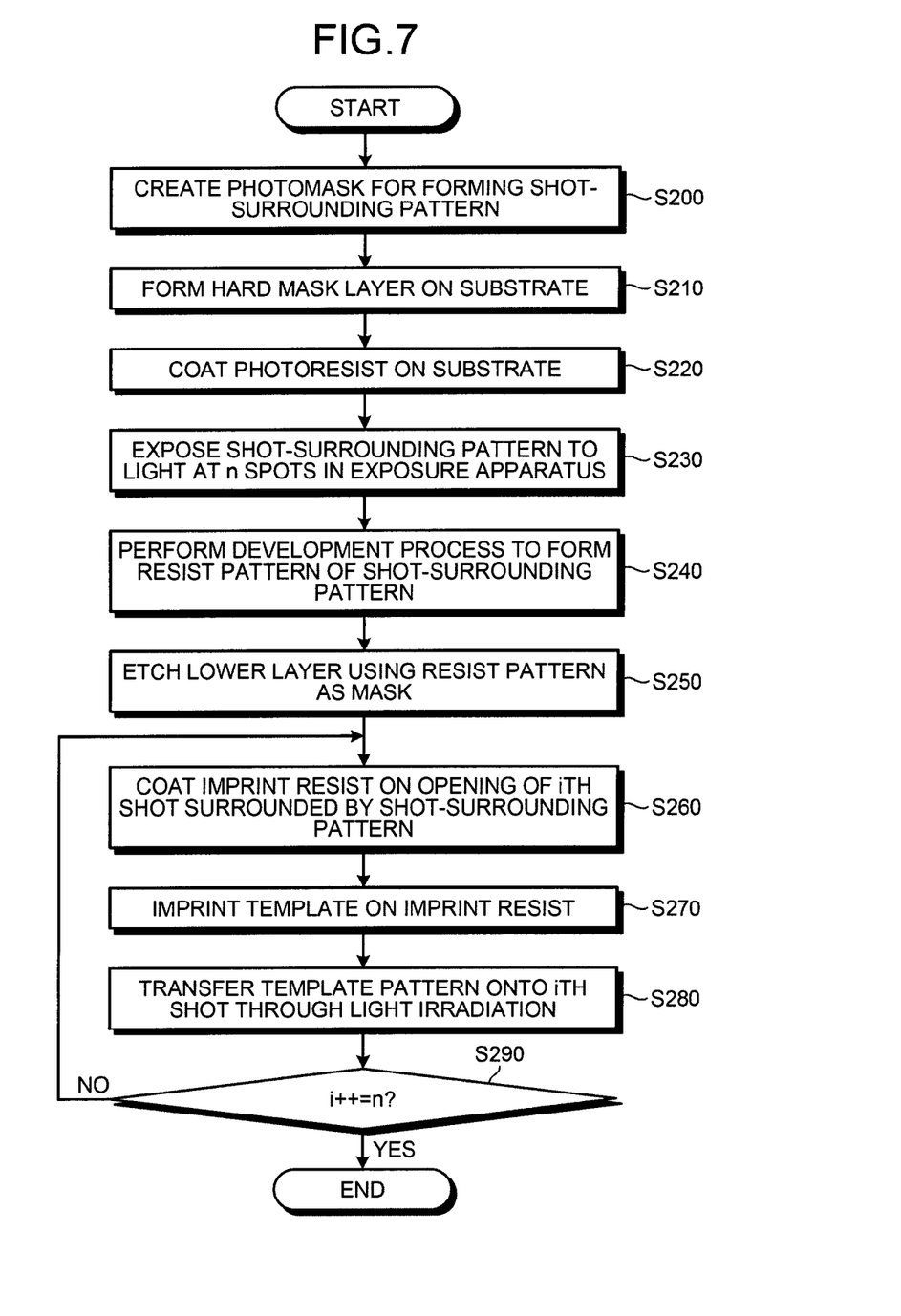
FIG. 7 is a flowchart illustrating the procedure of a pattern formation process according to a second embodiment.

FIG. 7 is a flowchart illustrating the procedure of a pattern formation process according to the second embodiment. In addition, a procedure the same as the pattern formation process according to the first embodiment will not be repeatedly described. Here, a substrate W2 includes a wafer and the like, in which a semiconductor device is formed, similarly to the substrate W1 described in the first embodiment.

A photomask for forming a shot-surrounding pattern 1B is created (step S200). A hard mask layer (a hard mask layer 5A which will be described later) is formed on the substrate W2 (step S210), and then photoresist 1A is coated on the substrate W2 using a resist coating apparatus (step S220).

Furthermore, the photomask is carried into an exposure apparatus such as a stepper. In the exposure apparatus, the shot-surrounding pattern 5B is exposed to light at n spots on the substrate surface by using the photomask. Thus, exposure processes corresponding to n shots are performed on the substrate W2 (step S230). Then, a development process of the substrate W2 is performed using a development apparatus and the like. Thus, a resist pattern (a resist pattern 1C which will be described later) equal to the shot-surrounding pattern 1B is formed on the substrate W2 (step S240).

Thereafter, a lower layer side (the hard mask layer 5A) of the resist pattern 1C is etched using the resist pattern 10 as a mask (step S250). Thus, a hard mask pattern as the shot-surrounding pattern 5B is formed on the substrate W2.

Then, as a process the same as the first embodiment, an imprint process of the substrate W2 is performed. In addition, the processes of steps S260, S270, S280, and S290 in FIG. 7 correspond to those of steps S140, S150, S160, and S170 in FIG. 2.

Figure 8A:
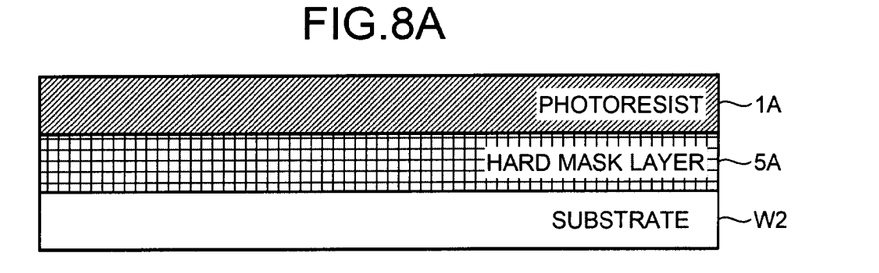
FIGS. 8A to 8D are diagrams explaining the procedure of a pattern formation process according to the second embodiment.

FIGS. 8A to 8D are diagrams explaining the procedure of a pattern formation process according to the second embodiment. FIGS. 8A to 8D are sectional views of the substrate W2. As illustrated in FIG. 8A, a film (not illustrated) to be processed is formed on the substrate W2, and then the hard mask layer 5A is stacked on the substrate W2. The hard mask layer 5A is a stack for pattern transfer, and for example, is amorphous silicon.

Figure 8B:
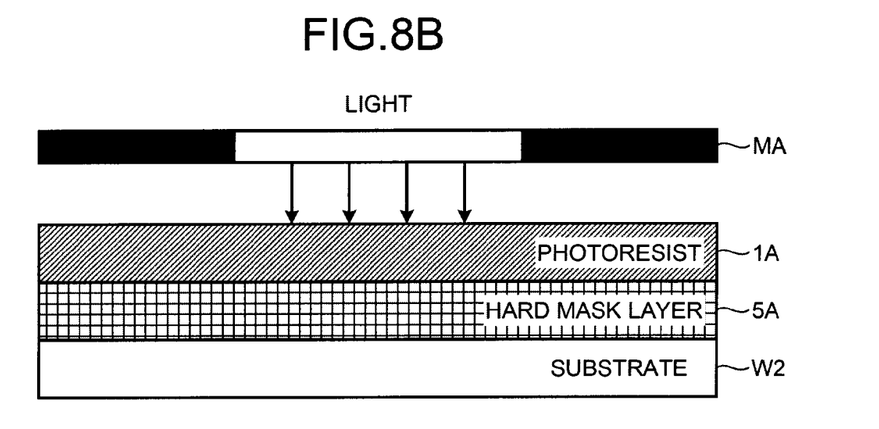
Figure 8C:
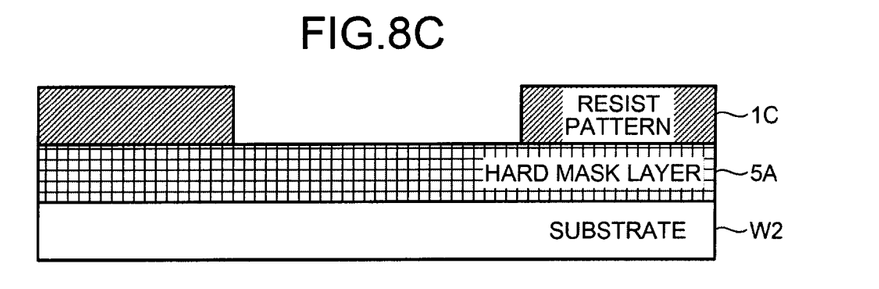

Thereafter, the photoresist 1A is coated on the hard mask layer 5A. Next, as illustrated in FIG. 8B, the photoresist 1A on the substrate W2 is exposed to light using a photomask MA and the like. Then, a development process of the substrate W2 is performed. Thus, as illustrated in FIG. 8C, the resist pattern 10 corresponding to a mask pattern of the photomask MA is formed.

Figure 8D:
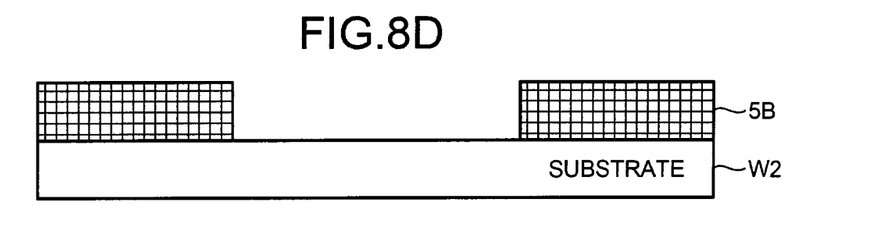

Next, the hard mask layer 5A is etched using the resist pattern 1C as a mask. Then, if the resist pattern 1C is stripped, the shot-surrounding pattern 5B is formed on the substrate W2 as illustrated in FIG. 8D. In this way, the shot-surrounding pattern 5B is formed in a lattice-shaped area of an outer periphery of each shot and a wafer peripheral area. The shot-surrounding pattern 5B has an opening similarly to the shot-surrounding pattern 1B, and areas surrounded by the shot-surrounding pattern 5B are imprint shot areas 3. Thereafter, processes the same as those of FIGS. 5D to 5F are performed, so that imprint patterns corresponding to a plurality of shots are formed on the substrate W2.

Figure 9:
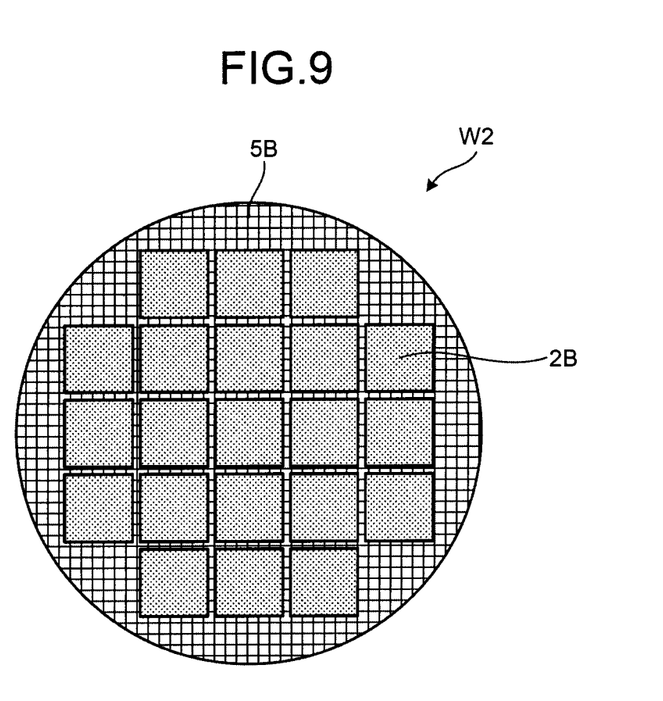
FIG. 9 is a diagram explaining an arrangement position of a shot-surrounding pattern according to the second embodiment.

FIG. 9 is a diagram explaining an arrangement position of the shot-surrounding pattern according to the second embodiment. FIG. 9 is a plan view of the substrate W2. In addition, FIG. 9 illustrates the case in which no gap exists between an adjacent shot-surrounding pattern 5B and the shot-surrounding pattern 5B, and the shot-surrounding pattern 5B is continuously formed.

Imprinting is performed in each imprint shot on the substrate W2, so that the imprint resist 2B is formed in the imprint shot areas 3 on the substrate W2 as illustrated in FIG. 9. At this time, since the shot-surrounding pattern 5B presents as an outer peripheral wall among the imprint shots, the substrate W2 is not exposed.

In addition, a gap may exist between an adjacent shot-surrounding pattern 5B and the shot-surrounding pattern 5B. Furthermore, the shot-surrounding pattern 5B may be formed in the vicinity of the outer periphery of the substrate W2.

Meanwhile, a positioning pattern (an alignment mark) used at the time of imprinting may be formed in the shot-surrounding pattern 1B or the shot-surrounding pattern 5B. Hereinafter, the case will be described in which the alignment mark is formed in the shot-surrounding pattern 5B.

Figure 10A:
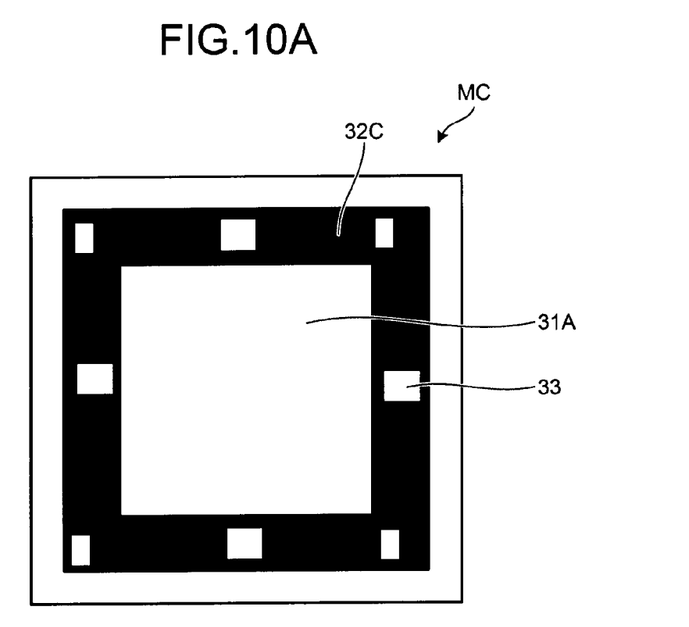
FIG. 10A is a diagram illustrating a configuration example of a photomask when forming an alignment mark in a shot-surrounding pattern.
Figure 10B:
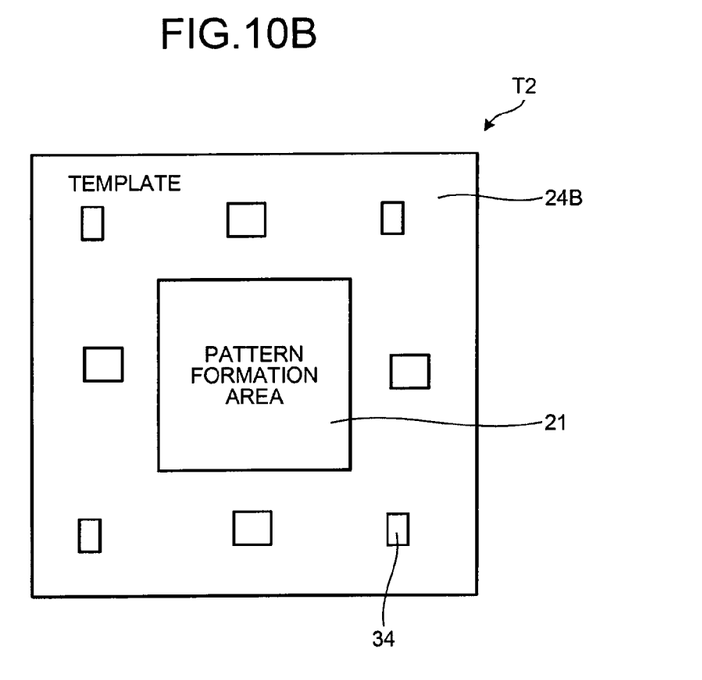
FIG. 10B is a diagram illustrating a configuration example of a template when forming an alignment mark in a shot-surrounding pattern.

FIG. 10A is a diagram illustrating a configuration example of a photomask when forming the alignment mark in the shot-surrounding pattern, and FIG. 10B is a diagram illustrating a configuration example of a template when forming the alignment mark in the shot-surrounding pattern.

FIG. 10A is a plan view of a photomask MC. The photomask MC is provided in the mask surface thereof with a light transmission unit 31A and a light blocking unit 32C. The light blocking unit 32C is configured by forming alignment marks 33 in a light blocking unit 32A.

The shot-surrounding pattern 1B is formed on the substrate W2 using the photomask MC, so that an alignment pattern corresponding to the alignment marks 33 is also formed in the shot-surrounding pattern 5B. Since the shot-surrounding pattern 5B is a wall pattern with a predetermined height similarly to the shot-surrounding pattern 1B, the alignment pattern has a hole shape (a sidewall surface of a box shape).

FIG. 10B is a plan view of a template T2. The template T2 is provided with alignment marks 34 used as overlap marks at the time of imprinting. The alignment marks 34 are positioned in a non-transfer area 24B, and are formed at the same position as the alignment marks 33 (the alignment pattern). Thus, at the time of imprinting, the alignment pattern formed on the substrate W2 and the alignment mark 34 are aligned to be at the same position. The pattern shape of the alignment mark 33 is changed, so that it is possible to adjust the matching likelihood at the time of imprinting.

In addition, the alignment mark 34 may be formed on the upper surface side of the template T2, or the bottom surface side (the side of a pattern formation area 21). Furthermore, the alignment mark 34 may be formed inside the template T2.

The photomask MC is used when the photoresist 1A is positive resist. In addition, when a photomask provided with the alignment marks 33 is used with respect to negative resist, a photomask is used in which the light transmission unit 31A and the light blocking unit 32C of the photomask MC are inverted from each other. Furthermore, the alignment marks 33 may also be provided to the photomask MB.

So far, the present embodiment has described the case in which no gap exists between the pattern formation area 21 and the non-transfer area 24A (the non-transfer area 24B). However, a gap may exist between the pattern formation area 21 and the non-transfer area 24A (the non-transfer area 24B).

Figure 11A:
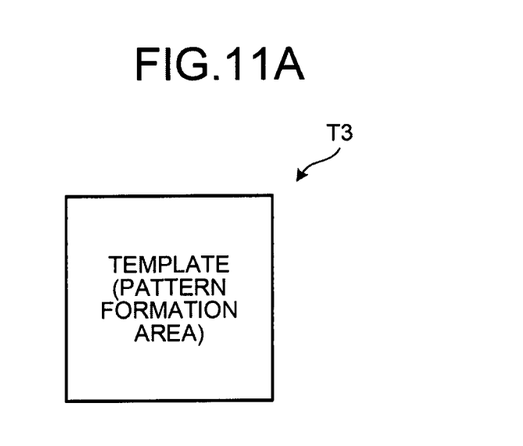
FIGS. 11A and 11B are diagrams illustrating another configuration example of a template.
Figure 11B:
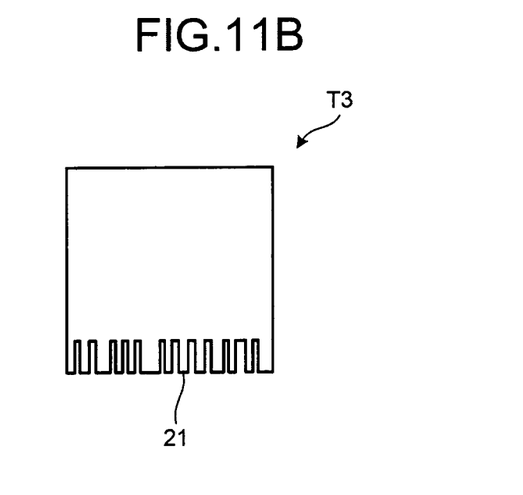

Hereinafter, another configuration example of the template Tx will be described. FIGS. 11A and 11B are diagrams illustrating another configuration example of a template. FIG. 11A is a bottom view of a template T3 which is an example of the template Tx, and FIG. 11B is a sectional view of the template T3.

The template T3 is obtained by removing the non-transfer area 24A from the template T1. In other words, almost entire surface of the bottom surface of the template T3 serves as the pattern formation area 21 having a rectangular shape.

According to the second embodiment, before the imprint resist 2A is coated on the substrate W2, since the shot-surrounding pattern 5B is formed on the substrate W2, it is possible to prevent the imprint resist 2A from overflowing to an adjacent shot by the shot-surrounding pattern 5B, resulting in the prevention of a pattern formation defect.

Furthermore, it is possible to prevent the overflow of the imprint resist 2A by the shot-surrounding pattern 5B with a narrow area, resulting in the formation of many shot patterns on one substrate W2.

According to the first and second embodiments as described above, it is possible to prevent the occurrence of a pattern formation defect and form many shot patterns on one substrate W1 and one substrate W2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, the method comprising:
    before forming a circuit pattern on a substrate using imprinting, forming a wall pattern with a predetermined height which surrounds a periphery of an area serving as imprint shots on the substrate in each imprint shot and allows the imprint shots to be separated from one another;
    dropping an imprint material in each imprint shot surrounded by the wall pattern; and
    firmly pressing a template to the imprint material, thereby allowing the circuit pattern to be formed in the imprint shots surrounded by the wall pattern.

2. The method according to claim 1,
    wherein, when forming the wall pattern, resist is coated on the substrate, and a resist pattern as the wall pattern is formed using the resist.

3. The method according to claim 1,
    wherein, when forming the wall pattern, a hard mask layer is formed on the substrate, and a hard mask pattern as the wall pattern is formed using the hard mask layer.

4. The method according to claim 1,
    wherein the wall pattern has a rectangular loop shape.

5. The method according to claim 2,
    wherein the wall pattern is formed using photolithography.

6. The method according to claim 1,
    wherein a height of the wall pattern is lower than a height difference between a pattern formation area, where a template pattern of the template is formed, and an outer peripheral area which is a peripheral area of the pattern formation area.

7. A method of manufacturing a semiconductor device, the method comprising:
    before forming a circuit pattern on a semiconductor substrate using imprinting, forming a wall pattern with a predetermined height which surrounds a periphery of an area serving as imprint shots on the semiconductor substrate in each imprint shot and allows the imprint shots to be separated from one another;
    dropping an imprint material in each imprint shot surrounded by the wall pattern;
    firmly pressing a template to the imprint material, thereby allowing the circuit pattern to be formed in the imprint shots surrounded by the wall pattern; and
    producing a semiconductor device using the substrate provided with the circuit pattern.

8. The method according to claim 7,
    wherein, when forming the wall pattern, resist is coated on the semiconductor substrate, and a resist pattern as the wall pattern is formed using the resist.

9. The method according to claim 7,
    wherein, when forming the wall pattern, a hard mask layer is formed on the semiconductor substrate, and a hard mask pattern as the wall pattern is formed using the hard mask layer.

10. The method according to claim 7,
    wherein the wall pattern has a rectangular loop shape.

11. The method according to claim 8,
    wherein the wall pattern is formed using photolithography.

12. The method according to claim 7,
    wherein a height of the wall pattern is lower than a height difference between a pattern formation area, where a template pattern of the template is formed, and an outer peripheral area which is a peripheral area of the pattern formation area.

13. A method of manufacturing a template, the method comprising:
    before forming a circuit pattern on a first substrate using imprinting, forming a wall pattern with a predetermined height which surrounds a periphery of an area serving as imprint shots on the first substrate in each imprint shot and allows the imprint shots to be separated from one another;
    dropping an imprint material in each imprint shot surrounded by the wall pattern; and
    firmly pressing a first template to the imprint material, thereby allowing the circuit pattern to be formed in the imprint shots surrounded by the wall pattern,
    wherein the first substrate provided with the circuit pattern includes a second template which allows the circuit pattern to be transferred onto a second substrate through imprinting.

14. The method according to claim 13,
    wherein, when forming the wall pattern, resist is coated on the first substrate, and a resist pattern as the wall pattern is formed using the resist.

15. The method according to claim 13,
    wherein, when forming the wall pattern, a hard mask layer is formed on the first substrate, and a hard mask pattern as the wall pattern is formed using the hard mask layer.

16. The method according to claim 13,
    wherein the wall pattern has a rectangular loop shape.

17. The method according to claim 14,
    wherein the wall pattern is formed using photolithography.

18. The method according to claim 13,
    wherein a height of the wall pattern is lower than a height difference between a pattern formation area, where a template pattern of the first template is formed, and an outer peripheral area which is a peripheral area of the pattern formation area.

* * * * *